(12) United States Patent
Nishigaki et al.

(10) Patent No.: US 10,848,144 B2
(45) Date of Patent: Nov. 24, 2020

(54) SWITCHING CONTROL CIRCUIT

(71) Applicant: SHARP KABUSHIKI KAISHA, Sakai, Osaka (JP)

(72) Inventors: Akihiro Nishigaki, Sakai (JP); Koichiro Fujita, Sakai (JP); Kenichi Tanaka, Sakai (JP); Tsuyoshi Nakahira, Kobe (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 16/697,011

(22) Filed: Nov. 26, 2019

(65) Prior Publication Data

US 2020/0177175 A1    Jun. 4, 2020

Related U.S. Application Data

(60) Provisional application No. 62/773,744, filed on Nov. 30, 2018.

(51) Int. Cl.
| | | |
|---|---|---|
| H03B 1/00 | (2006.01) | |
| H03K 3/00 | (2006.01) | |
| H03K 17/16 | (2006.01) | |
| H03K 4/08 | (2006.01) | |
| H03K 3/84 | (2006.01) | |

(52) U.S. Cl.
CPC ............. *H03K 17/162* (2013.01); *H03K 3/84* (2013.01); *H03K 4/08* (2013.01)

(58) Field of Classification Search
CPC ........... H03K 17/162; H03K 3/84; H03K 4/08
USPC .......................................................... 327/109
See application file for complete search history.

(56) References Cited

U.S. PATENT DOCUMENTS

2007/0210776 A1* 9/2007 Oka ........................ H02M 1/44
                                                            323/283
2019/0181853 A1    6/2019 Kobayashi et al.

FOREIGN PATENT DOCUMENTS

| JP | 2007-209130 A | 8/2007 | |
|---|---|---|---|
| JP | 2012-080739 A | 4/2012 | |
| JP | 2018-057072 A | 4/2018 | |
| WO | WO-2019171509 A1 * | 9/2019 | .............. H02M 1/08 |

* cited by examiner

*Primary Examiner* — Metasebia T Retebo
(74) *Attorney, Agent, or Firm* — ScienBiziP, P.C.

(57) ABSTRACT

A switching control circuit that controls on/off of a switching element is provided to efficiently disperse EMI noise due to high-speed switching, the switching control circuit includes a gate driver, a variable capacitance element connected to a gate of the switching element, and a capacitance changing circuit that randomly changes a capacitance of the variable capacitance element.

12 Claims, 16 Drawing Sheets

1: SWITCHING ELEMENT
2: DIRECT-CURRENT BLOCKING CAPACITOR
3: VARIABLE CAPACITANCE DIODE
5: GATE RESISTOR
10: OSCILLATOR
20: PSEUDORANDOM-NUMBER GENERATING CIRCUIT
30: INTEGRATOR
40: GATE DRIVER
50: GATE DRIVE POWER SOURCE
60: PWM CONTROL SIGNAL GENERATING UNIT
100: SWITCHING CONTROL CIRCUIT
110: ANALOG SIGNAL GENERATOR

1: SWITCHING ELEMENT
5: GATE RESISTOR
10: OSCILLATOR
20: PSEUDORANDOM-NUMBER GENERATING CIRCUIT
30: INTEGRATOR
40: GATE DRIVER
50: GATE DRIVE POWER SOURCE
60: PWM CONTROL SIGNAL GENERATING UNIT
110: ANALOG SIGNAL GENERATOR
200: SWITCHING CONTROL CIRCUIT
270: PIN DIODE

1: SWITCHING ELEMENT
2: DIRECT-CURRENT BLOCKING CAPACITOR
3: VARIABLE CAPACITANCE DIODE
5: GATE RESISTOR
10: OSCILLATOR
20: PSEUDORANDOM-NUMBER GENERATING CIRCUIT
30: INTEGRATOR
40: GATE DRIVER
50: GATE DRIVE POWER SOURCE
60: PWM CONTROL SIGNAL GENERATING UNIT
300: SWITCHING CONTROL CIRCUIT
310: ANALOG SIGNAL GENERATOR
335: DIGITAL-TO-ANALOG CONVERTER

1: SWITCHING ELEMENT
50: GATE DRIVE POWER SOURCE
60: PWM CONTROL SIGNAL GENERATING UNIT
500: SWITCHING CONTROL CIRCUIT
502: DIRECT-CURRENT BLOCKING CAPACITOR
503: VARIABLE CAPACITANCE DIODE
505: GATE RESISTOR
510: RING OSCILLATOR
520: PSEUDORANDOM-NUMBER GENERATING CIRCUIT
530: INTEGRATOR
540: GATE DRIVER

1: SWITCHING ELEMENT
2: DIRECT-CURRENT BLOCKING CAPACITOR
3: VARIABLE CAPACITANCE DIODE
5: GATE RESISTOR
40: GATE DRIVER
50: GATE DRIVE POWER SOURCE
60: PWM CONTROL SIGNAL GENERATING UNIT
600: SWITCHING CONTROL CIRCUIT
610: ANALOG SIGNAL GENERATOR
630: INTEGRATOR
635: WHITE NOISE GENERATOR

1: SWITCHING ELEMENT
5: GATE RESISTOR
40: GATE DRIVER
50: GATE DRIVE POWER SOURCE
60: PWM CONTROL SIGNAL GENERATING UNIT
610: ANALOG SIGNAL GENERATOR
630: INTEGRATOR
635: WHITE NOISE GENERATOR
700: SWITCHING CONTROL CIRCUIT
770: VARIABLE CAPACITANCE CAPACITOR

1: SWITCHING ELEMENT
50: GATE DRIVE POWER SOURCE
60: PWM CONTROL SIGNAL GENERATING UNIT
800: SWITCHING CONTROL CIRCUIT
802: DIRECT-CURRENT BLOCKING CAPACITOR
803: VARIABLE CAPACITANCE DIODE
805: GATE RESISTOR
830: INTEGRATOR
835: WHITE NOISE GENERATOR
840: GATE DRIVER

1: SWITCHING ELEMENT
5: GATE RESISTOR
40: GATE DRIVER
50: GATE DRIVE POWER SOURCE
60: PWM CONTROL SIGNAL GENERATING UNIT
910: ANALOG SIGNAL GENERATOR
900: SWITCHING CONTROL CIRCUIT
930: INTEGRATOR
935: WHITE NOISE GENERATOR
970: REGULATOR

SWITCHING CONTROL CIRCUIT

TECHNICAL FIELD

The present invention relates to a switching control circuit that controls driving of a switching element.

BACKGROUND ART

Heretofore, a technology for reducing EMI (Electro Magnetic Interference) noise that occurs during switching has been proposed for switching control circuits for controlling driving of switching elements. For example, PTL 1 discloses a technology in which pulse width control is performed on a timing at which an EMI noise level is larger of on and off timings of a switching element, thereby reducing the EMI noise level without changing a carrier frequency.

Also, in PTL 2, a buffer circuit is used to periodically change a gate current supplied to the gate of a switching element to change the switching speed, thereby reducing influences that EMI noise that occurs during driving of the switching element has on peripheral equipment. Also, PTL 3 discloses a technology in which the slew rate of an output signal is periodically changed to thereby disperse harmonic components included in rising and falling of the output signal.

CITATION LIST

Patent Literature

[PTL 1] Japanese Unexamined Patent Application Publication No. 2007-209130 (published on Aug. 16, 2007)
[PTL 2] Japanese Unexamined Patent Application Publication No. 2012-80739 (published on Apr. 19, 2012)
[PTL 3] Japanese Unexamined Patent Application Publication No. 2018-57072 (published on Apr. 5, 2018)

SUMMARY OF INVENTION

Technical Problem

However, the technology described in PTL 1 has a problem that the peak of EMI noise occurs in a particular frequency component. Also, in the technology disclosed in PTL 2, since the pattern of the switching speed depends on the number of buffers that are used, frequency dispersion of EMI noise is restricted, and there is a problem that the peak value of the EMI noise cannot be efficiently dispersed.

Also, in the technology disclosed in PTL 3, although the driving ability is changed using a current mirror circuit constituted by an operational amplifier and a transistor, there is an upper limit on the operating frequency. Thus, when the technology is applied to a high-speed switching device, such as a compound semiconductor FET, the upper limit of the operating frequency restricts the high-speed characteristic thereof, thus the performance of the high-speed switching device cannot be sufficiently utilized. Also, when attempt is made to reduce the circuit scale, since the number of change patterns of the slew rate is restricted, and thus the rising speed and the falling speed of a gate signal of the switching element are similarly restricted.

One aspect of the present invention has been conceived in view of the foregoing situation and is aimed to realize a technology that can efficiently disperse EMI noise due to high-speed switching.

Solution to Problem (1) One embodiment of the present invention is a switching control circuit that controls on/off of a switching element, the switching control circuit comprising: a gate driver connected to a gate of the switching element, a variable capacitance element connected to the gate of the switching element; and a capacitance changing circuit connected to the variable capacitance element to randomly change a capacitance of the variable capacitance element.

(2) Also, an embodiment of the present invention is a switching control circuit in which, in addition to (1) described above, the capacitance changing circuit comprises an oscillator, a pseudorandom-number generating circuit connected to the oscillator, and an integrator connected to the pseudorandom-number generating circuit and the variable capacitance element.

(3) Also, an embodiment of the present invention is a switching control circuit in which, in addition to (2) described above, the variable capacitance element includes a variable capacitance diode.

(4) Also, an embodiment of the present invention is a switching control circuit in which, in addition to (2) described above, the variable capacitance element includes a PIN diode.

(5) Also, an embodiment of the present invention is a switching control circuit in which, in addition to (1) described above, the capacitance changing circuit comprises an oscillator, a pseudorandom-number generating circuit connected to the oscillator, a digital-to-analog converter connected to the pseudorandom-number generating circuit, and an integrator connected to the digital-to-analog converter and the variable capacitance element.

(6) Also, an embodiment of the present invention is a switching control circuit in which, in addition to (1) described above, the variable capacitance element is a magnetoresistance element comprising a gate resistor connected to the gate of the switching element and a coil magnetically coupled to the gate resistor, and the capacitance changing circuit comprises an oscillator, a pseudorandom-number generating circuit connected to the oscillator, an integrator connected to the pseudorandom-number generating circuit, and a current driver connected to the integrator and the coil.

(7) Also, an embodiment of the present invention is a switching control circuit in which, in addition to (1) described above, the capacitance changing circuit comprises a ring oscillator, a pseudorandom-number generating circuit connected to the ring oscillator, and an integrator connected to the pseudorandom-number generating circuit and the variable capacitance element; and the gate driver, the variable capacitance element, and the capacitance changing circuit are formed in one integrated circuit.

(8) Also, an embodiment of the present invention is a switching control circuit in which, in addition to (1) described above, the capacitance changing circuit comprises a white noise generation circuit, and an integrator connected to the white noise generation circuit and the variable capacitance element.

(9) Also, an embodiment of the present invention is a switching control circuit in which, in addition to (1) described above, the capacitance changing circuit is a circuit that causes generation of at least one of a triangular wave that is asynchronous with a switching cycle of the switching element and a sawtooth wave that is asynchronous with the switching cycle of the switching element.

(10) Also, an embodiment of the present invention is a switching control circuit in which, in addition to (8) or (9) described above, the variable capacitance element includes a variable capacitance diode.

(11) Also, an embodiment of the present invention is a switching control circuit in which, in addition to (8) or (9) described above, the variable capacitance element includes a variable capacitance capacitor.

(12) Also, an embodiment of the present invention is a switching control circuit in which, in addition to (8) or (9) described above, the variable capacitance element is connected in parallel with a gate resistor connected to the gate of the switching element, and the capacitance changing circuit outputs a signal for randomly changing the capacitance of the variable capacitance element in only a switching transition period of the switching element.

(13) Also, an embodiment of the present invention is a switching control circuit in which, in addition to (8) or (9) described above, the gate driver, the variable capacitance element, and the capacitance changing circuit are formed in one integrated circuit.

(14) Also, an embodiment of the present invention is a switching control circuit that controls on/off of a switching element. The switching control circuit comprises: a gate driver connected to a gate of the switching element; a drive power source supply circuit to which power source is input and that outputs a drive power source for driving the gate driver; and a capacitance changing circuit connected to the drive power source supply circuit to randomly change the drive power source.

Advantageous Effects of Invention

According to one aspect of the present invention, it is possible to efficiently disperse EMI noise due to high-speed switching.

DESCRIPTION OF EMBODIMENTS

First Embodiment

Figure 1:
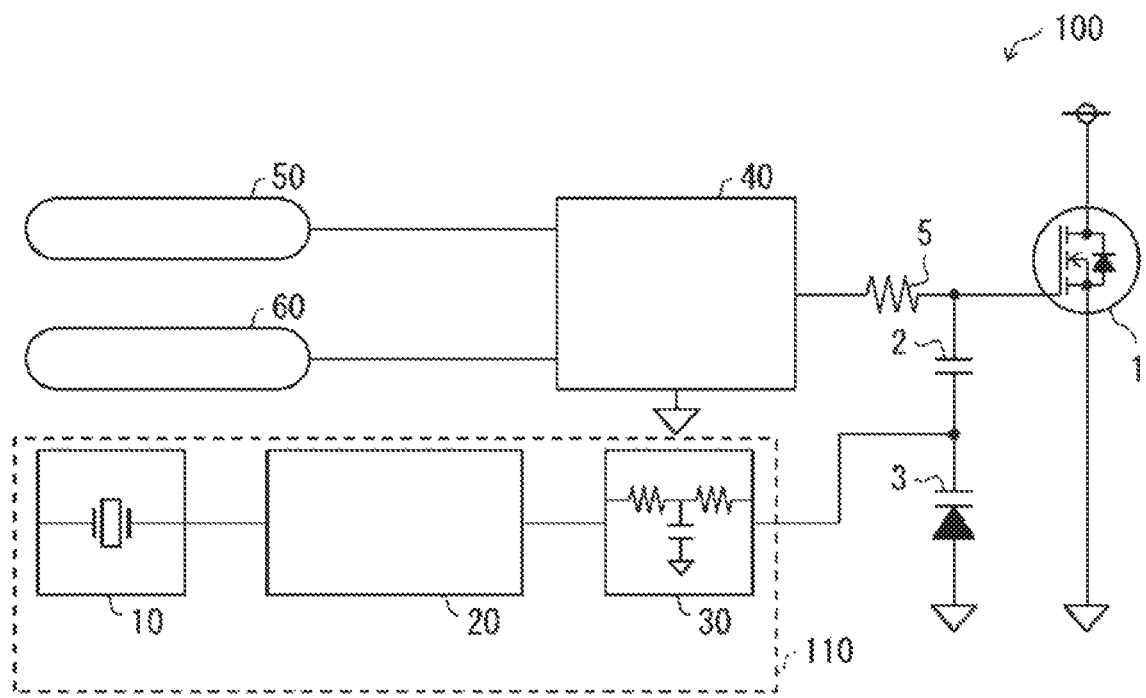
FIG. 1 is a block diagram illustrating the configuration of a major portion of a switching control circuit according to a first embodiment of the present invention.

One embodiment of the present invention will be described below in detail. FIG. 1 is a block diagram illustrating the configuration of a major portion of a switching control circuit 100 according to a first embodiment. The switching control circuit 100 is a control circuit that controls on/off of a switching element 1. The switching control circuit 100 comprises a gate driver 40, a variable capacitance diode (a variable capacitance element) 3, and an analog signal generator (a capacitance changing circuit) 110. Also, the switching control circuit 100 comprises a gate drive power source 50 and a PWM control signal generating unit 60. Also, the switching control circuit 100 comprises a direct-current blocking capacitor 2.

The gate drive power source 50 supplies a drive power source voltage to the gate driver 40.

The PWM control signal generating unit 60 generates a PWM signal that becomes a gate signal for the switching element 1.

The gate driver 40 is connected to a gate of the switching element and functions, together with a gate resistor 5, as an element driving unit for driving the switching element 1. The gate driver 40 outputs an on/off signal to the switching element 1, based on the PWM signal generated by the PWM control signal generating unit 60.

The variable capacitance diode 3 is connected to the gate of the switching element 1 via the direct-current blocking capacitor 2. The direct-current blocking capacitor 2 transmits only signal current and blocks direct current. The variable capacitance diode 3 is connected to the gate of the switching element in parallel with the gate driver 40.

The analog signal generator 110 is connected to the variable capacitance diode 3 and randomly changes the capacitance of the variable capacitance diode 3.

It is sufficient as long as the variable capacitance diode 3 has a feature that the internal capacitance changes according to a voltage that is applied, and a configuration including a variable-capacitance capacitor, instead of the variable capacitance diode 3, as the variable capacitance element may be used.

The analog signal generator 110 comprises an oscillator 10, a pseudorandom-number generating circuit 20, and an integrator 30.

The oscillator 10 causes a pulse signal to be generated. The pulse signal generated by the oscillator 10 is a "1", "0" digital signal having a frequency higher than that of the PWM signal generated by the PWM control signal generating unit 60.

The pseudorandom-number generating circuit 20 is connected to the oscillator 10. The pseudorandom-number generating circuit 20 is a circuit that generates, for example, an M-sequence random number.

The integrator 30 is connected to the pseudorandom-number generating circuit 20 and the variable capacitance diode 3. The integrator 30 converts the "1", "0" digital signal output from the pseudorandom-number generating circuit 20 into an analog signal, integrates the analog signal with respect to time, and outputs the analog signal to the variable capacitance diode 3. In the analog signal generator 110, the frequency characteristics of a signal that is output can be arbitrarily changed using circuit constants (a resistance value and a capacitor capacitance) of the integrator 30.

The analog signal generator 110 generates a random and stepless digital signal by using the oscillator 10 and the pseudorandom-number generating circuit 20. Also, the analog signal generator 110 converts the digital signal, generated by the oscillator 10 and the pseudorandom-number generating circuit 20, into a random and stepless analog signal by passing the digital signal through the integrator 30.

In the above description, the "connected" includes both a case of being directly connected without involvement of another element and a case of being indirectly connected via another element.

The random and stepless analog signal generated by the analog signal generator 110 is input to the variable capacitance diode 3, which is connected in parallel with the gate driver 40. The capacitance of the variable capacitance diode 3 changes randomly and steplessly in accordance with the random and stepless analog signal input from the analog signal generator 110. This changes the value of the variable capacitance signal to change the rising speed and the falling speed of a switching speed, thereby randomly and steplessly varying the gradient of the gate signal.

With regard to the setting range of the switching speed, switching loss due to the switching element 1 increases, as the switching speed is reduced, that is, as the gradient of the gate signal is reduced. Thus, it is to be noted that the switching speed needs to be set within the range of permissible switching loss.

Figure 4:
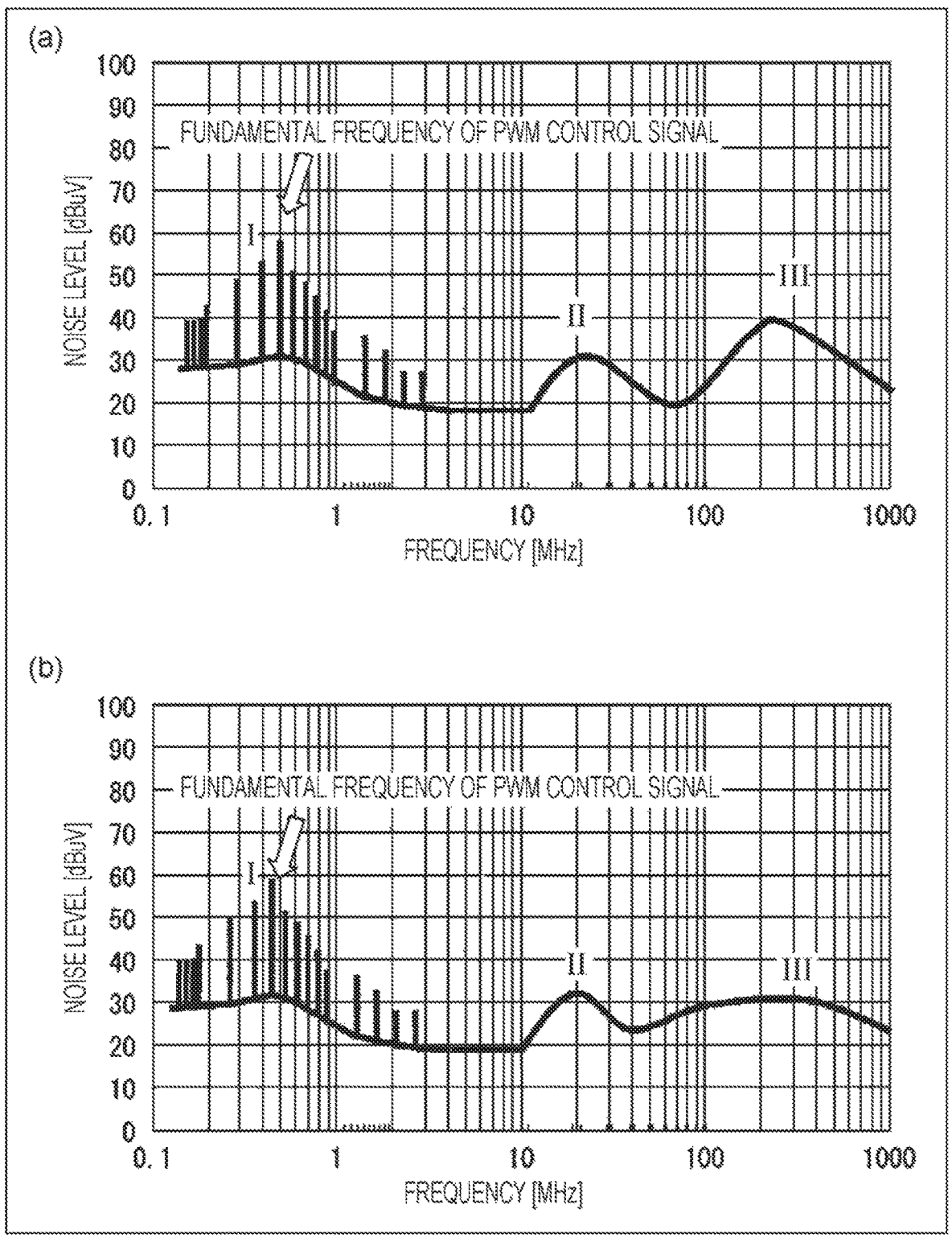
FIG. 4 is a graph illustrating noise characteristics during switching, (a) in FIG. 4 illustrating conventional noise characteristics, and (b) in FIG. 4 illustrating noise characteristics when the switching control circuit according to the first embodiment is used.

Meanwhile, in a switching power source using a switching element, noise (I in (a) in FIG. 4) due to switching, noise (II in (a) in FIG. 4) due to ringing, and noise (III in (a) in FIG. 4) due to switching speed occur during switching. The noise due to switching includes noise components that are in a frequency region of a few hundred kHz to 10 MHz and is noise that occurs due to electromagnetic induction that occurs in leakage flux from an inductor. The noise due to ringing is noise that is present in a frequency region of a few tens of MHz and is noise that occurs due to vibration by parasitic inductance and parasitic capacitance inside a device. The noise due to switching speed is noise having a very high frequency that lies in a frequency region of 100 MHz or higher and is electromagnetic interference (Electro Magnetic Interference: EMI) noise that occurs owing to transient high-frequency current.

As described above, in the present embodiment, since the rising speed and the falling speed of the gate signal vary randomly and steplessly, it is possible to disperse high-frequency noise that occurs in the gate voltage. This suppresses occurrence of the peak of EMI noise in a unique frequency region, making it possible to reduce EMI noise.

Figure 2:
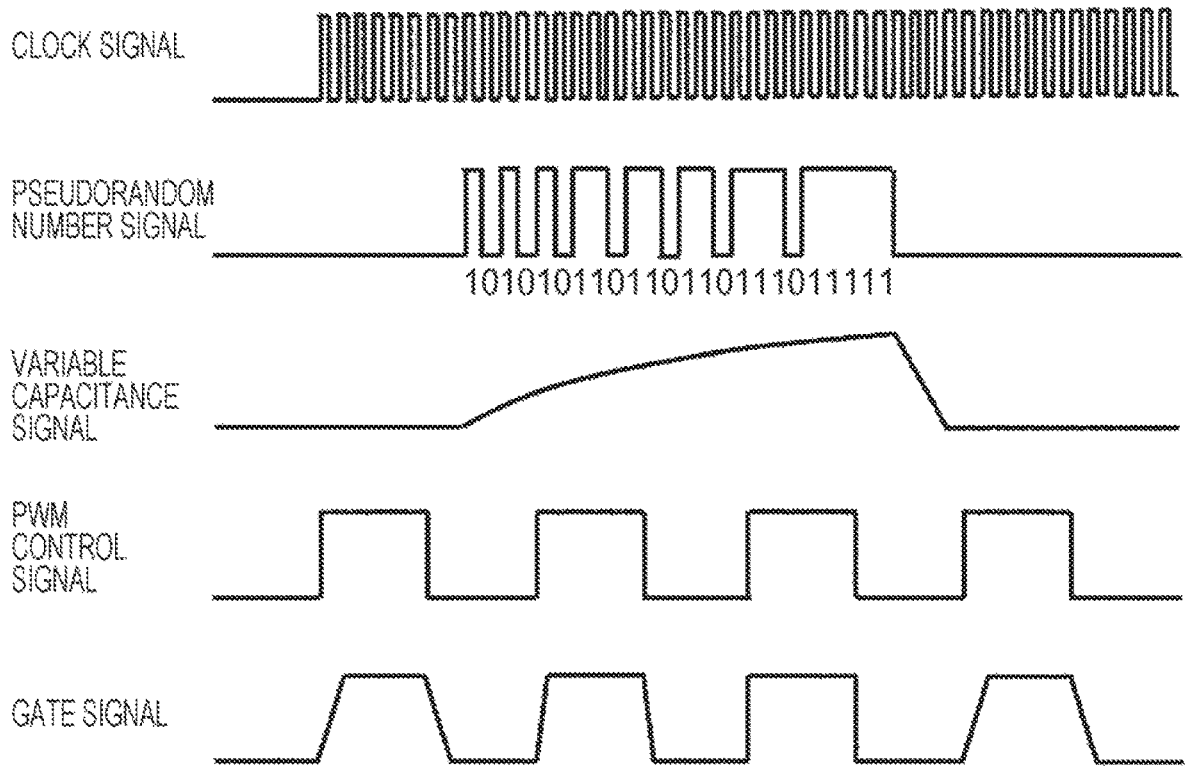
FIG. 2 is a graph illustrating a relationship between a PWM control signal and a gate signal in a switching control circuit according to the first embodiment.

FIG. 2 is a graph illustrating the PWM control signal output from the PWM control signal generating unit 60 and the gate signal. In FIG. 2, a clock signal is an output of the oscillator 10. A pseudorandom number signal is an output of the pseudorandom-number generating circuit 20. A variable capacitance signal is an output of the integrator 30. As illustrated in FIG. 2, as opposed to the PWM control signal, the gate signal changes in rising speed and falling speed in response to variations in the variable capacitance signal.

Figure 3:
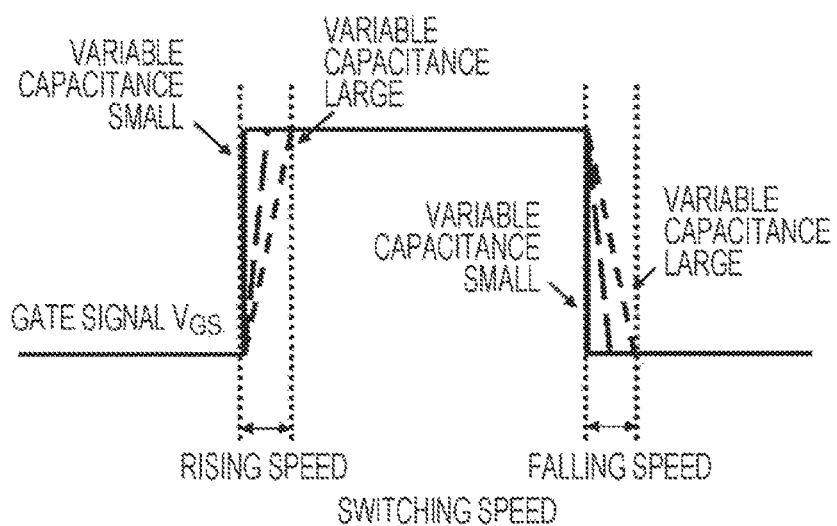
FIG. 3 is a graph illustrating relationships of the value of a variable capacitance signal, a switching speed, and the gradient of the gate signal.

FIG. 3 is a graph illustrating relationships of the value of the variable capacitance signal, the switching speed (the rising speed and the falling speed), and the gradient of the gate signal. As illustrated in FIG. 3, when the value of the variable capacitance signal changes, the switching speed changes. When the value of the variable capacitance signal is small, the rising speed and the falling speed increase, and the gradient of the gate signal becomes steep. When the value of the variable capacitance signal is large, the rising speed and the falling speed decrease, and the gradient of the gate signal becomes gentle. In this manner, in the present embodiment, the value of the variable capacitance signal is varied to thereby change the switching speed and change the gradient of the gate signal. This suppresses occurrence of the peak of EMI noise, making it possible to reduce EMI noise.

(a) in FIG. 4 illustrates the frequency of noise when on/off of the switching element is controlled according to the PWM control signal, and (b) in FIG. 4 illustrates the frequency of noise when on/off of the switching element is controlled according to a gate signal varied by the analog signal generator 110. As illustrated in (a) in FIG. 4, when the on/off of the switching element is controlled according to the PWM control signal, the peak of noise (noise denoted by III) due to the switching speed occurs in the frequency region of 100 MHz or higher.

In the present embodiment, the on/off of the switching element is controlled according to the gate signal varied by the analog signal generator 110, to cause the switching speed to change randomly and steplessly. This can also reduce the noise level in the frequency region of 100 MHz or higher, as illustrated in (b) in FIG. 4, can preferably disperse noise in a unique frequency, and can suppress occurrence of the peak of noise in the unique frequency.

As described above, the analog signal generator 110 and the variable capacitance diode 3 are connected to the gate of the switching element 1 in parallel with the gate driver to cause the switching speed to change randomly and steplessly, thereby making it possible to efficiently disperse EMI noise due to high-speed switching.

FIG. 2 is a graph illustrating influences of a noise diffusion effect when the time constant of the integrator 30 is larger than the frequency of the PWM control signal. As illustrated in FIG. 2, when the time constant of the integrator 30 is larger than the frequency of the PWM control signal, the variable capacitance signal changes steplessly, thus making it possible to efficiently disperse EMI noise due to the switching speed of the switching element 1.

Figure 5:
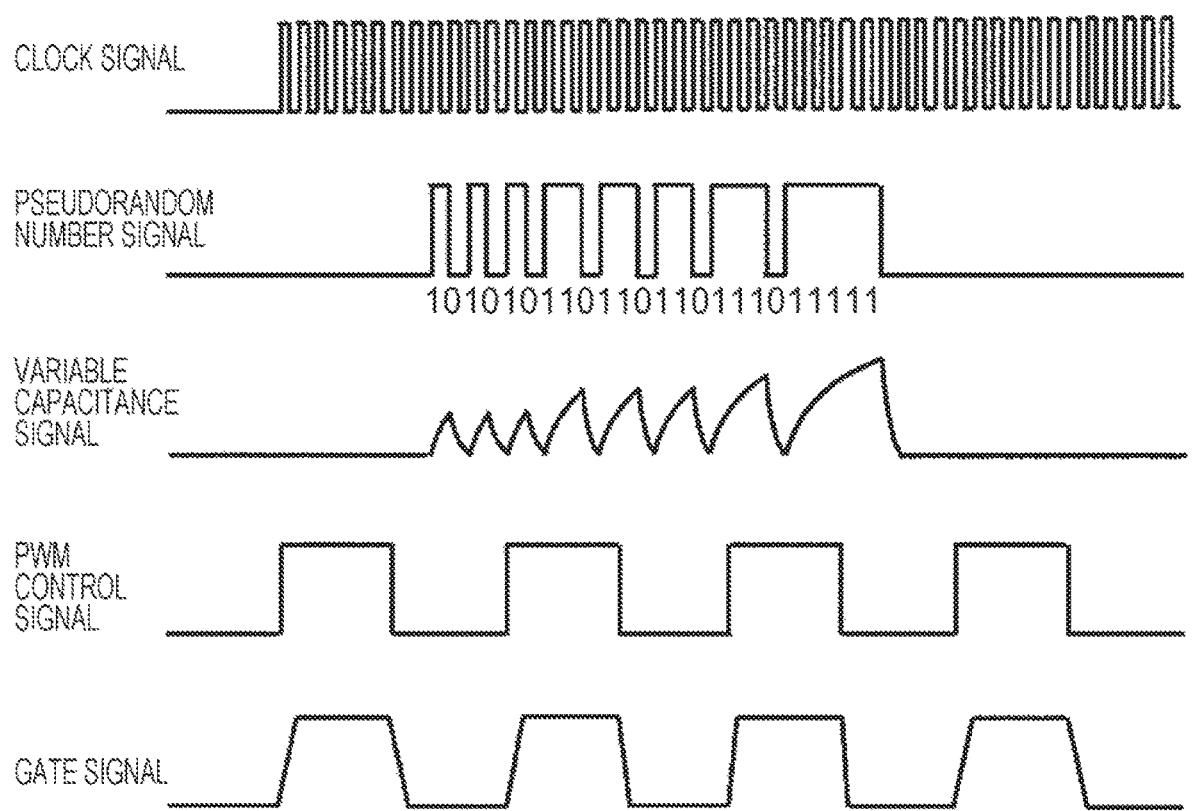
FIG. 5 is a graph illustrating influences of a noise diffusion effect when the time constant of an integrator is equivalent to the frequency of the PWM control signal.

FIG. 5 is a graph illustrating influences of the noise diffusion effect when the time constant of the integrator 30 is equivalent to the frequency of the PWM control signal. As illustrated in FIG. 5, when the time constant of the integrator 30 is equivalent to the frequency of the PWM control signal, the variable capacitance signal changes stepwisely. Thus, the dispersion of EMI noise due to the switching speed of the switching element 1 also becomes stepwise.

Figure 6:
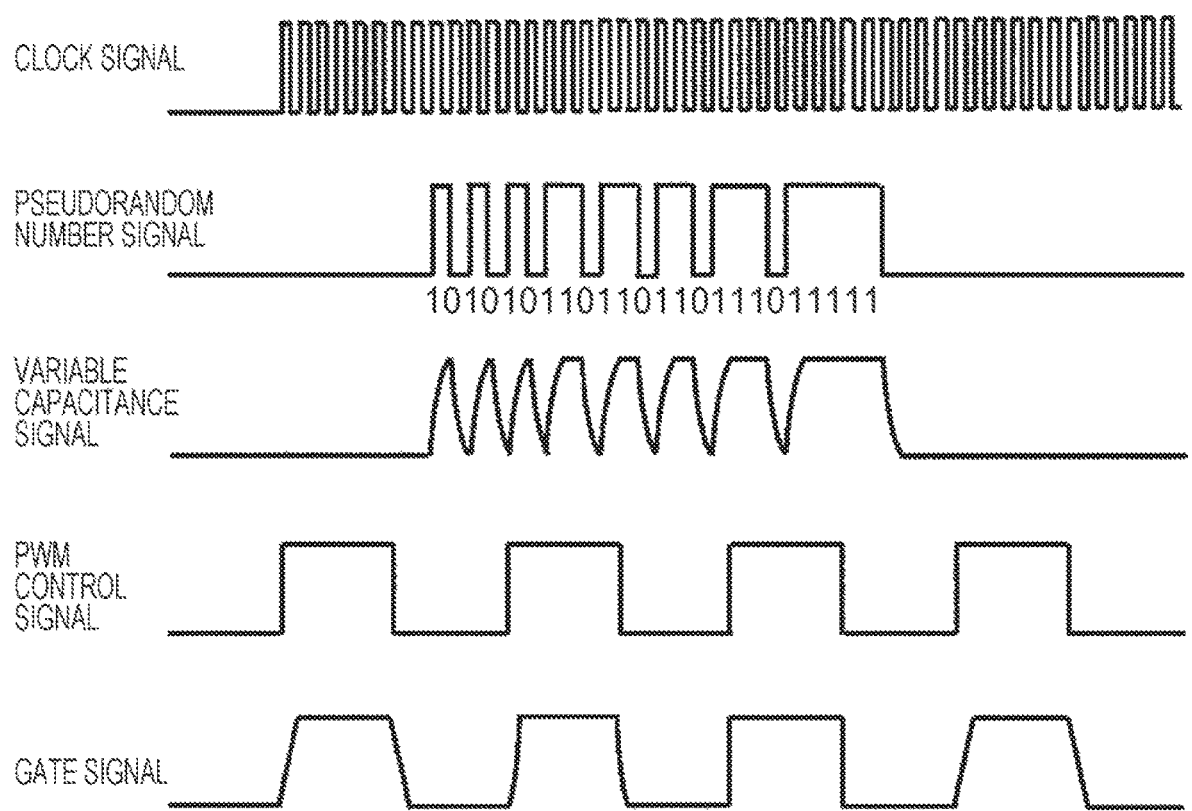
FIG. 6 is a graph illustrating influences of the noise diffusion effect when the time constant of the integrator is smaller than the frequency of the PWM control signal.

Also, FIG. 6 is a graph illustrating influences of the noise diffusion effect when the time constant of the integrator 30 is smaller than the frequency of the PWM control signal. As illustrated in FIG. 6, when the time constant of the integrator 30 is smaller than the frequency of the PWM control signal, changes in the variable capacitance signal become binary. Thus, the dispersion of EMI noise due to the switching speed of the switching element 1 is restricted.

Thus, it is desirable that the time constant of the integrator 30 be larger than the frequency of the PWM control signal.

As described above, according to the first embodiment, the switching control circuit 100 that controls on/off of the switching element 1 comprises: the gate driver 40 connected to the gate of the switching element 1, the variable capacitance element (the variable capacitance diode 3) connected to the gate of the switching element 1, and the capacitance changing circuit (the analog signal generator 110) connected to the variable capacitance element to randomly change the capacitance of the variable capacitance element. Thus, the capacitance changing circuit randomly changes the capacitance of the variable capacitance element to change the gradient of a gate signal, making it possible to randomly change the rising speed and falling speed of the switching speed. Hence, it is possible to preferably disperse noise in a unique frequency determined according to the characteristics of the gate driver 40, specifically, EMI noise due to high-speed switching.

Also, the capacitance changing circuit comprises the oscillator 10, the pseudorandom-number generating circuit 20 connected to the oscillator 10, and the integrator 30 connected to the pseudorandom-number generating circuit 20 and the variable capacitance element. Thus, the pseudorandom-number generating circuit 20 converts a "1", "0" digital signal, generated by the oscillator 10, into a random "1", "0" digital signal, the "1", "0" digital signal output by the pseudorandom-number generating circuit 20 is converted into an analog signal through the integrator 30, and the analog signal is integrated with respect to time and output to the variable capacitance element. This can randomly change the capacitance of the variable capacitance element and can preferably disperse EMI noise in a unique frequency determined according to the characteristics of the gate driver 40.

Second Embodiment

A second embodiment of the present invention will be described below. For convenience of description, members having the same functions as the members described in the first embodiment above are denoted by the same reference numerals, and descriptions thereof are not repeated.

Although, in the first embodiment, the variable capacitance diode 3 is used as the variable capacitance element, the variable capacitance element is not limited thereto.

Figure 7:
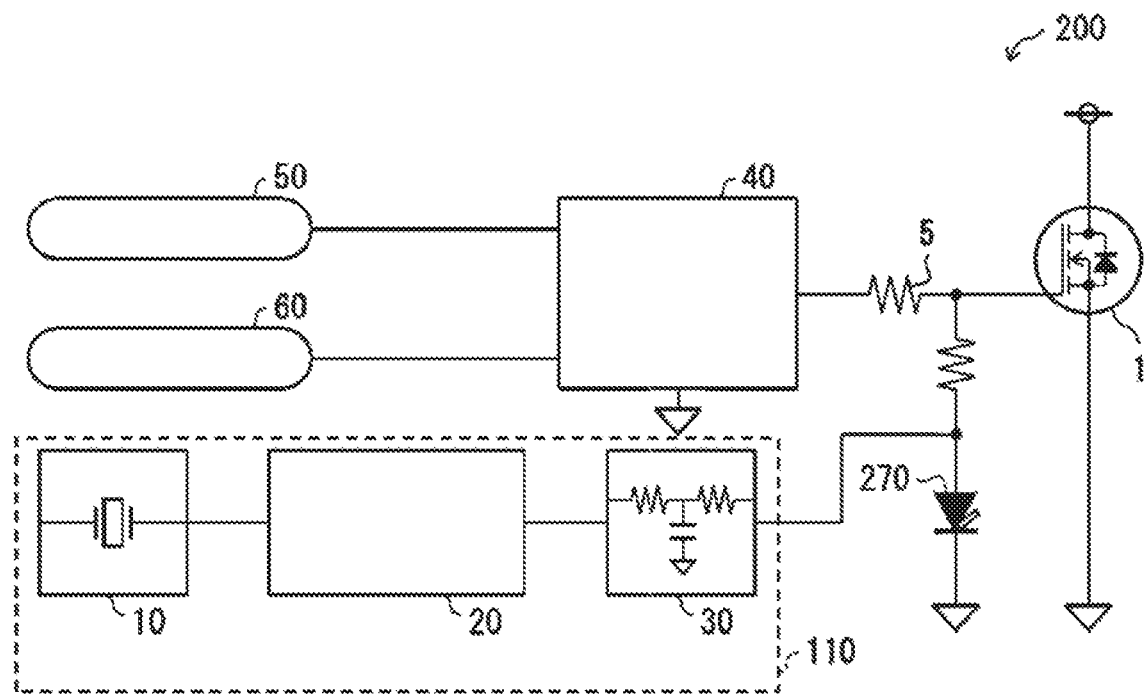
FIG. 7 is a block diagram illustrating the configuration of a major portion of a switching control circuit according to a second embodiment.

FIG. 7 is a block diagram illustrating the configuration of a major portion of a switching control circuit 200 according to a second embodiment. As illustrated in FIG. 7, the switching control circuit 200 has a configuration in which a variable capacitance element includes a PIN diode 270. Since other configurations are the same as those of the switching control circuit 100 described in the first embodiment, descriptions thereof are omitted.

The PIN diode 270 has a characteristic that functions as a variable resistor with forward current. The resistance value of the PIN diode 270 changes randomly and steplessly in accordance with a random and stepless analog signal input from an analog signal generator 110.

The resistance value of the PIN diode 270 is randomly changed according to forward current, as described above, to thereby randomly change the gradient of the gate signal and change the switching speed, which suppresses occurrence of the peak of EMI noise in a unique frequency determined according to characteristics of a gate driver 40, making it possible to reduce EMI noise.

Third Embodiment

A third embodiment of the present invention will be described below. For convenience of description, members having the same functions as the members described in the embodiments above are denoted by the same reference numerals, and descriptions thereof are not repeated.

Figure 8:
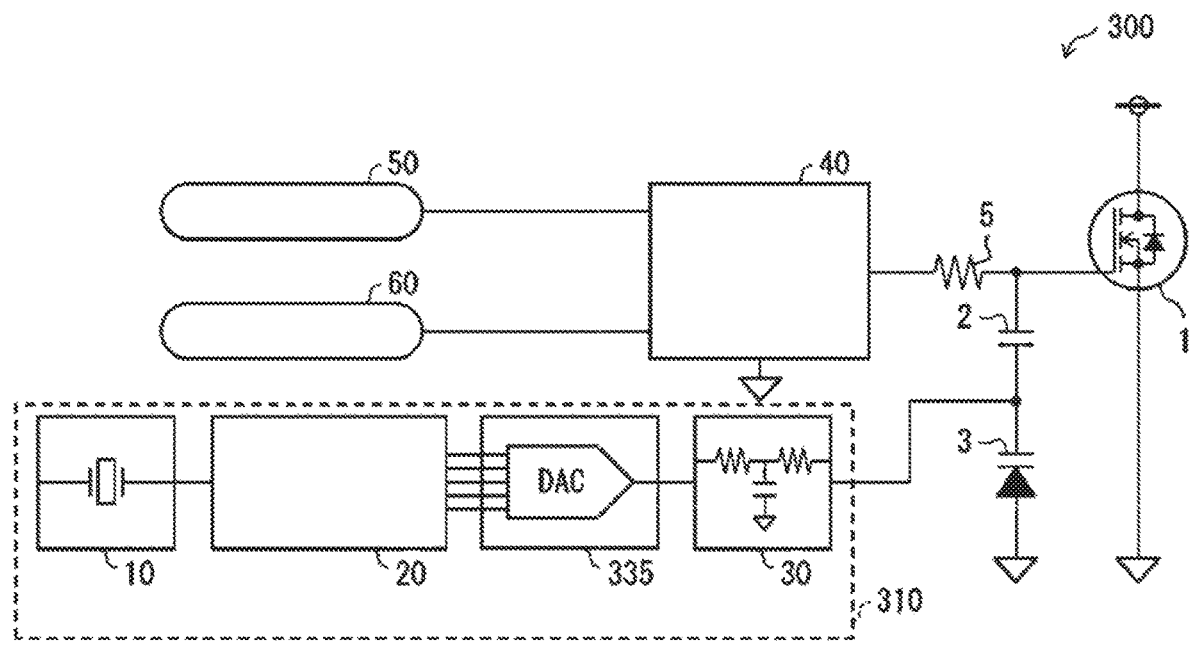
FIG. 8 is a block diagram illustrating the configuration of a major portion of a switching control circuit according to a third embodiment.

FIG. 8 is a block diagram illustrating the configuration of a major portion of a switching control circuit 300 according to the third embodiment. In the switching control circuit 300, the configuration of an analog signal generator 310 differs from that in the first embodiment, as illustrated in FIG. 8. Since other configurations are the same as those of the switching control circuit 100 described in the first embodiment, descriptions thereof are omitted.

The analog signal generator 310 comprises an oscillator 10, a pseudorandom-number generating circuit 20 connected to the oscillator 10, a digital-to-analog converter (D/converter) 335 connected to the pseudorandom-number generating circuit 20, and an integrator 30 connected to the digital-to-analog converter 335 and a variable capacitance diode 3.

The digital-to-analog converter 335 converts a digital signal generated by the oscillator 10 and the pseudorandom-number generating circuit 20 into an analog signal. The integrator 30 integrates the analog signal from the digital-to-analog converter 335 with respect to time and outputs the analog signal to the variable capacitance diode 3.

As described above, the analog signal generator 310 may comprise the digital-to-analog converter 335 in addition to the integrator 30, and the digital-to-analog converter 335 may convert a digital signal generated by the pseudorandom-number generating circuit 20 into an analog signal and then output the analog signal to the integrator 30.

According to the configuration in the third embodiment, a "1", "0" digital signal output by the pseudorandom-number generating circuit 20 is converted into an analog signal via passage through the digital-to-analog converter 335, and the analog signal is integrated with respect to time by the integrator 30 and is output to the variable capacitance element. This makes it possible to randomly change the capacitance of the variable capacitance element and makes it possible to preferably disperse EMI noise in a unique frequency determined according to the characteristics of a gate driver 40.

Fourth Embodiment

A fourth embodiment of the present invention will be described below. For convenience of description, members having the same functions as the members described in the embodiments above are denoted by the same reference numerals, and descriptions thereof are not repeated.

Figure 9:
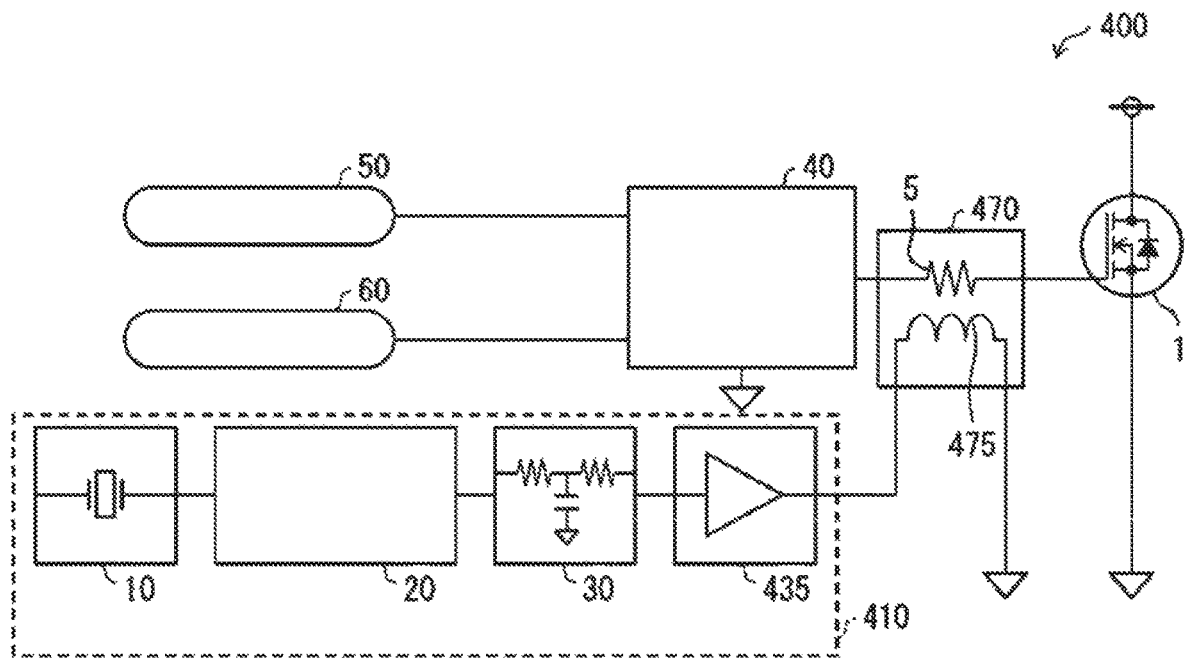
FIG. 9 is a block diagram illustrating the configuration of a major portion of a switching control circuit according to a fourth embodiment.

FIG. 9 is a block diagram illustrating the configuration of a major portion of a switching control circuit 400 according to the fourth embodiment. As illustrated in FIG. 9, in the switching control circuit 400, the configuration of an analog signal generator 410 differs from that in the first embodiment. Also, the switching control circuit 400 comprises a magnetoresistance element 470, instead of the variable capacitance diode 3, as the variable capacitance element. Since other configurations are the same as those of the switching control circuit 100 described in the first embodiment, descriptions thereof are omitted.

The analog signal generator 410 comprises an oscillator 10, a pseudorandom-number generating circuit 20 connected to the oscillator 10, an integrator 30 connected to the pseudorandom-number generating circuit 20, a current driver 435 connected to the integrator 30 and a coil of the magnetoresistance element 470.

The magnetoresistance element 470 is constituted by a gate resistor 5 connected to a gate of a switching element 1 and a coil 475 magnetically coupled to the gate resistor 5. The resistance of the magnetoresistance element 470 changes according to a magnetic field between the coil 475 and the gate resistor 5.

The current value of current that flows in the coil 475 varies randomly and steplessly in accordance with a random and stepless analog signal output from the analog signal generator 410. Thus, the resistance of the magnetoresistance element 470 changes, and the gradient of the gate signal for controlling the on/off of the switching element varies, so that the switching speed changes. Hence, occurrence of the peak of EMI noise in a unique frequency determined according to the characteristics of the gate driver 40 is suppressed, making it possible to reduce EMI noise.

Fifth Embodiment

A fifth embodiment of the present invention will be described below. For convenience of description, members having the same functions as the members described in the embodiments above are denoted by the same reference numerals, and descriptions thereof are not repeated.

Figure 10:
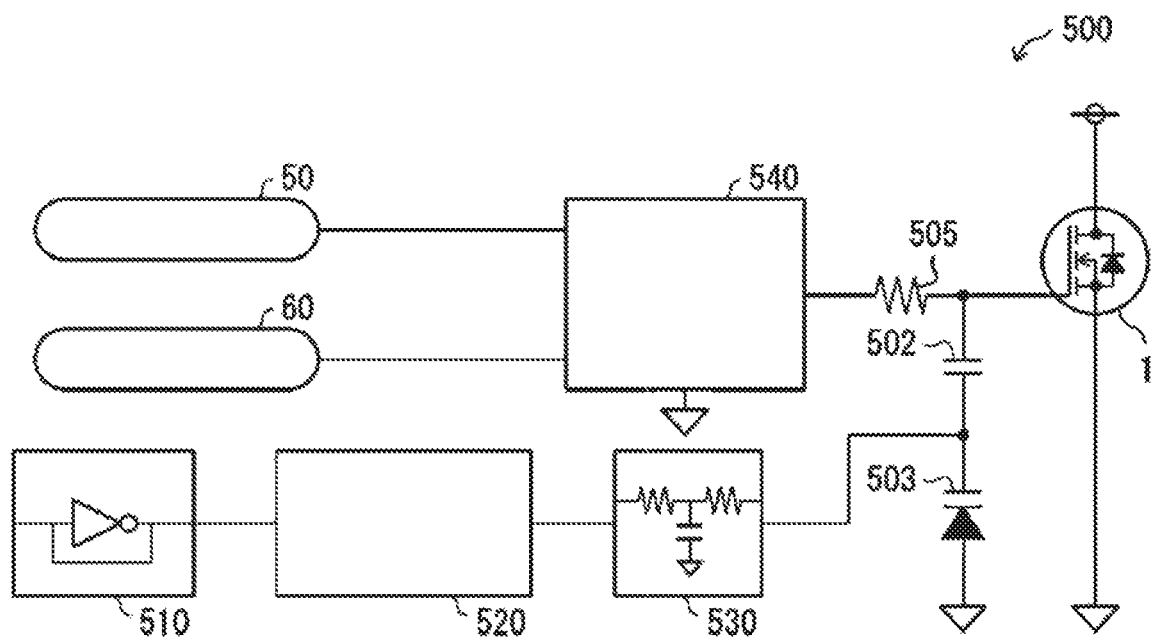
FIG. 10 is a block diagram illustrating the configuration of a major portion of a switching control circuit according to a fifth embodiment.

FIG. 10 is a block diagram illustrating the configuration of a major portion of a switching control circuit 500 according to the fifth embodiment. As illustrated in FIG. 10, the switching control circuit 500 comprises a ring oscillator 510 instead of the oscillator 10. The ring oscillator 510 is an oscillating circuit and causes generation of a "1", "0" digital signal having a frequency higher than that of a PWM signal.

A pseudorandom-number generating circuit 520, which converts a pulse signal output by the ring oscillator 510 into a random "1", "0" digital signal, is connected to the ring oscillator 510. An integrator 530, which converts the digital signal output from the pseudorandom-number generating circuit 520 into an analog signal and integrates the analog signal with respect to time, is connected to the pseudorandom-number generating circuit 520 and is located between it and a variable capacitance diode 503. In the switching control circuit 500, the ring oscillator 510, the pseudorandom-number generating circuit 520, and the integrator 530 function as a capacitance changing circuit for changing the capacitance of the variable capacitance diode 503.

A gate driver 540, the variable capacitance diode 503, and the capacitance changing circuit, constituted by the ring oscillator 510, the pseudorandom-number generating circuit 520, and the integrator 530, are formed in one integrated circuit. Also, a gate resistor 505 and a direct-current blocking capacitor 502 are formed in the integrated circuit. As described above, the switching control circuit 500 may be constituted by one integrated circuit.

According to this configuration, it is possible to preferably disperse noise in a unique frequency determined according to the characteristics of the gate driver 540.

Sixth Embodiment

A sixth embodiment of the present invention will be described below. For convenience of description, members having the same functions as the members described in the embodiments above are denoted by the same reference numerals, and descriptions thereof are not repeated.

Figure 11:
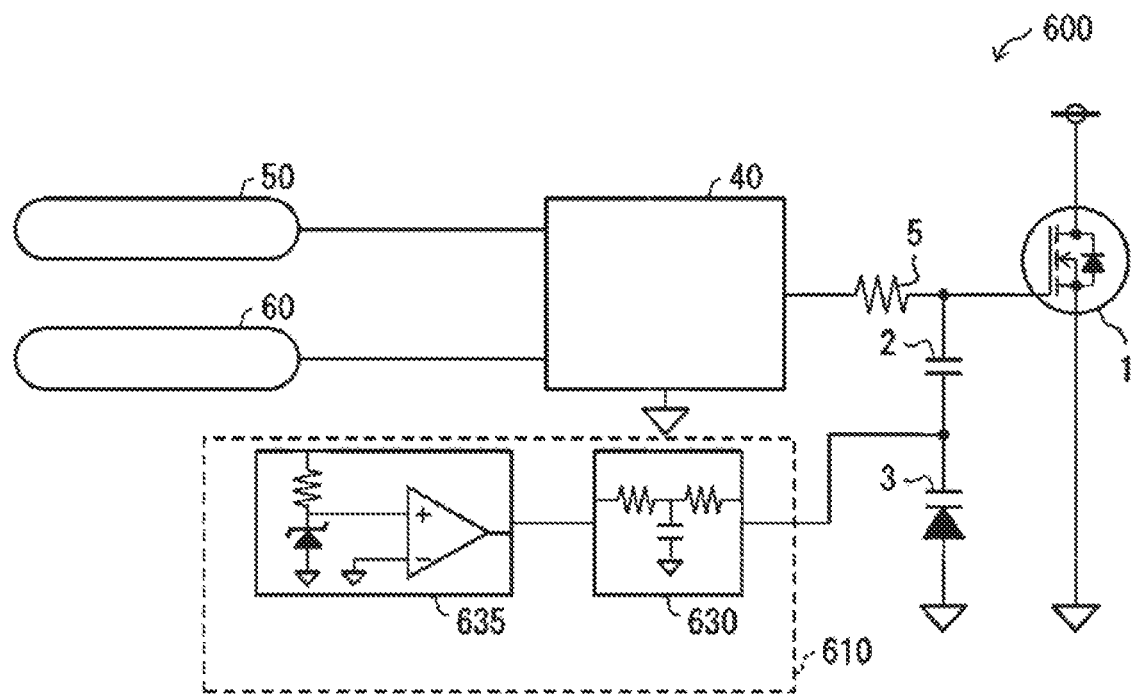
FIG. 11 is a block diagram illustrating the configuration of a major portion of a switching control circuit according to a sixth embodiment.

FIG. 11 is a block diagram illustrating the configuration of a major portion of a switching control circuit 600 according to the sixth embodiment. As illustrated in FIG. 11, in the switching control circuit 600, the configuration of an analog signal generator 610 differs from that in the first embodiment. Since other configurations are the same as those of the switching control circuit 100 described in the first embodiment, descriptions thereof are omitted.

The analog signal generator 610 includes a white noise generator 635 and an integrator 630.

The white noise generator 635 causes generation of white noise, which is non-periodic, random noise. For example, a white noise generator using a Zener diode can be used as the white noise generator 635. The white noise generator 635 is configured to comprise a Zener diode and an operational amplifier. The white noise generator 635 amplifies random noise, generated by passing very weak current through the Zener diode, by using the operational amplifier to thereby cause white noise to be generated and outputs the white noise.

The integrator 630 is connected to the white noise generator 635 and a variable capacitance element including the variable capacitance diode 3. The integrator 630 filters the white noise, output by the white noise generator 635, to generate an analog variable capacitance signal and outputs the generated variable capacitance signal to the variable capacitance element. In the analog signal generator 610, the frequency characteristics of a signal that is output can be arbitrarily changed using circuit constants (a resistance value and a capacitor capacitance) of the integrator 630.

Figure 12:
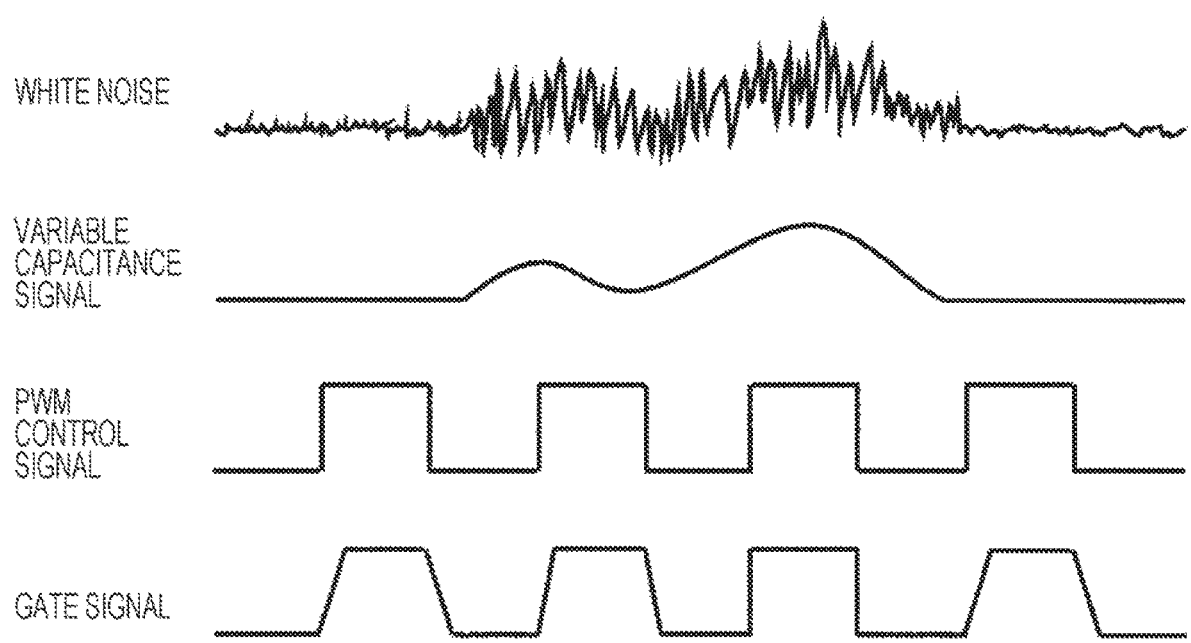
FIG. 12 is a graph illustrating a relationship between a PWM control signal and a gate signal in the switching control circuit according to the sixth embodiment.

FIG. 12 is a graph illustrating a PWM control signal output by a PWM control signal generating unit 60 and a gate signal. In FIG. 12, white noise is an output of the white noise generator 635. A variable capacitance signal is an output of the integrator 630 and is an analog signal obtained by filtering the white noise. As illustrated in FIG. 12, as opposed to the PWM control signal, the gate signal changes in gradient and changes in rising speed and falling speed, in accordance with variations in the variable capacitance signal. As the value of the variable capacitance signal decreases, the gradient of the gate signal becomes steep, and the switching speed increases. On the other hand, as the value of the variable capacitance signal increases, the gradient of the gate signal becomes gentle, and the switching speed decreases.

Figure 13:
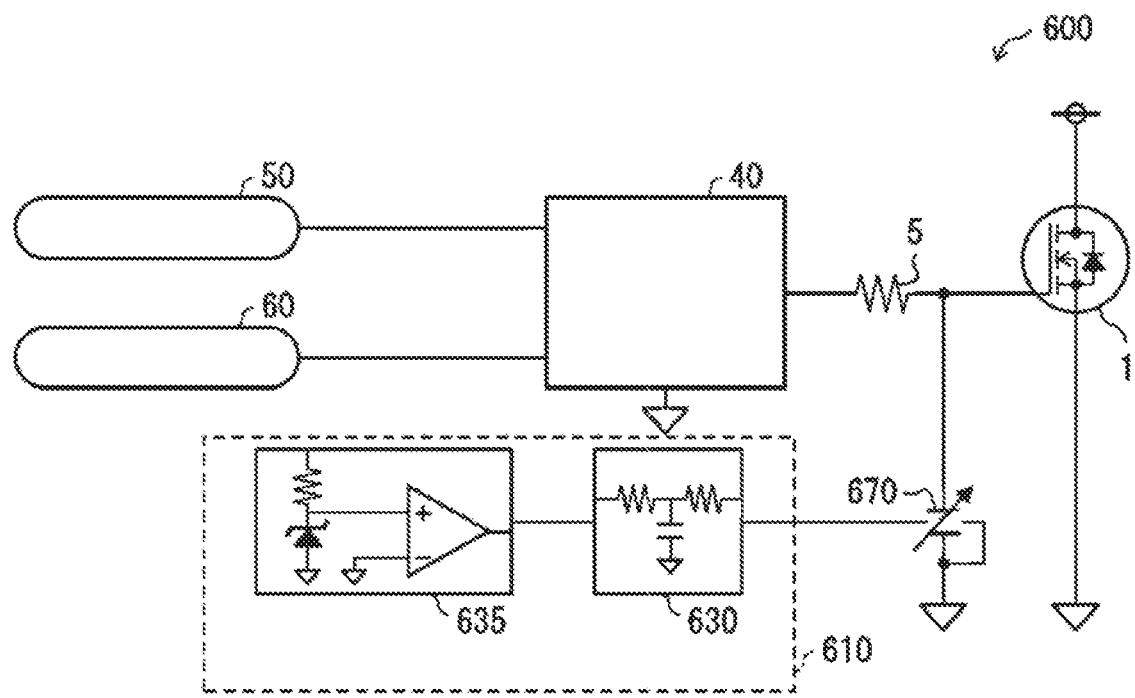
FIG. 13 is a block diagram illustrating the configuration of a major portion of a switching control circuit according to a modification of the sixth embodiment.

FIG. 13 is a block diagram illustrating the configuration of a major portion of a switching control circuit 600 according to a modification in the sixth embodiment. As illustrated in FIG. 13, in the switching control circuit 600, the variable capacitance element may have a configuration including a variable capacitance capacitor 670 instead of the variable capacitance diode 3.

Also, although not illustrated in the drawings, the analog signal generator may have a configuration that comprises a rectangular-wave generator that causes generation of a rectangular wave, instead of the white noise generator 635 that causes generation of white noise, and that causes generation of a triangular-wave variable capacitance signal that is asynchronous with the PWM control signal by passing an output from the rectangular-wave generator through the integrator 630. Also, the analog signal generator may have a configuration that comprises a rectangular-wave generator and an integrator whose capacitor charging time differs between when a voltage increases and when a voltage decreases and that causes generation of a sawtooth-wave variable capacitance signal, which has a saw-blade-shaped waveform that is asynchronous with the PWM control signal, by passing an output from the rectangular-wave generator through the integrator.

According to the sixth embodiment, the value of the variable capacitance signal output to the variable capacitance element is randomly changed to thereby randomly change the capacitance of the variable capacitance element, making it possible to preferably disperse EMI noise having a unique frequency determined according to the characteristics of a gate driver 40.

Seventh Embodiment

A seventh embodiment of the present invention will be described below. For convenience of description, members having the same functions as the members described in the embodiments above are denoted by the same reference numerals, and descriptions thereof are not repeated.

Figure 14:
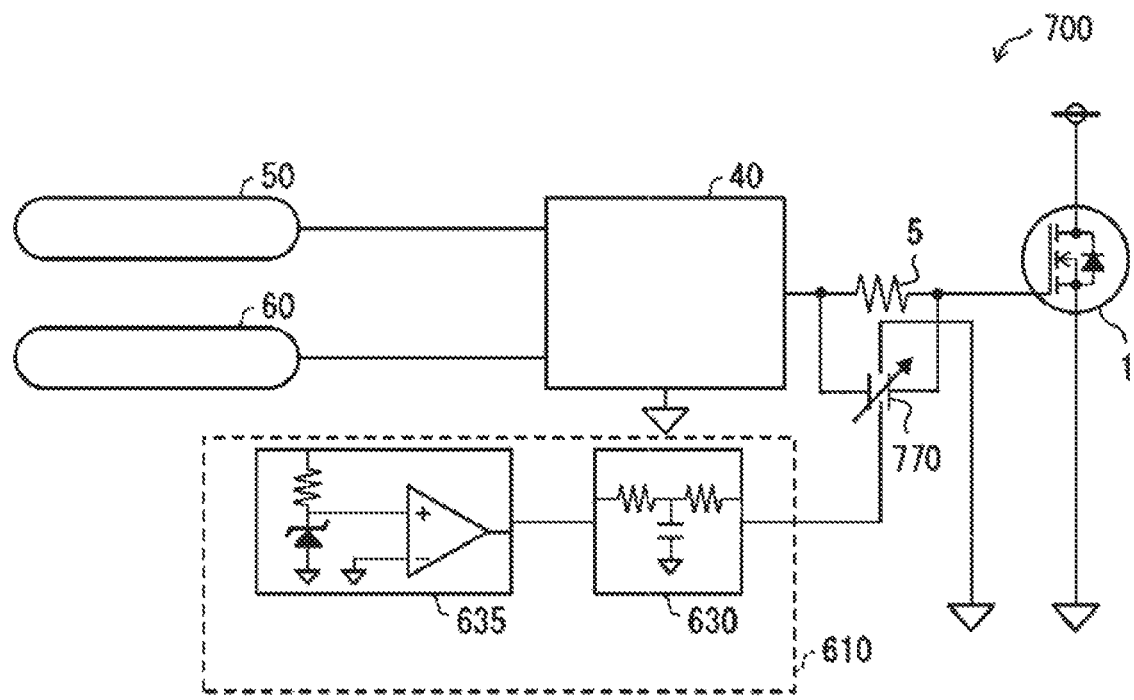
FIG. 14 is a block diagram illustrating the configuration of a major portion of a switching control circuit according to a seventh embodiment.

FIG. 14 is a block diagram illustrating the configuration of a major portion of a switching control circuit 700 according to the seventh embodiment. As illustrated in FIG. 14, the switching control circuit 700 differs from the sixth embodiment in the connection configuration of a variable capacitance capacitor 770. Since other configurations are the same as those of the switching control circuit 600 described in the sixth embodiment, descriptions thereof are omitted.

The variable capacitance capacitor 770 is connected in parallel with a gate resistor 5, which is connected to a gate of a switching element 1. When the variable capacitance capacitor 770, which is connected to the analog signal generator 610, is connected in parallel with the gate resistor 5, as described above, a variable capacitance signal output by the analog signal generator 610 is output in only a switching transition period of the switching element. Since the variable capacitance signal for randomly changing the capacitance of the variable capacitance element including the variable capacitance capacitor 770 is output in only a switching transition period of the switching element, as described above, it is possible to preferably disperse noise in a unique frequency determined according to the characteristics of the gate driver 40.

Eighth Embodiment

An eighth embodiment of the present invention will be described below. For convenience of description, members having the same functions as the members described in the embodiments above are denoted by the same reference numerals, and descriptions thereof are not repeated.

Figure 15:
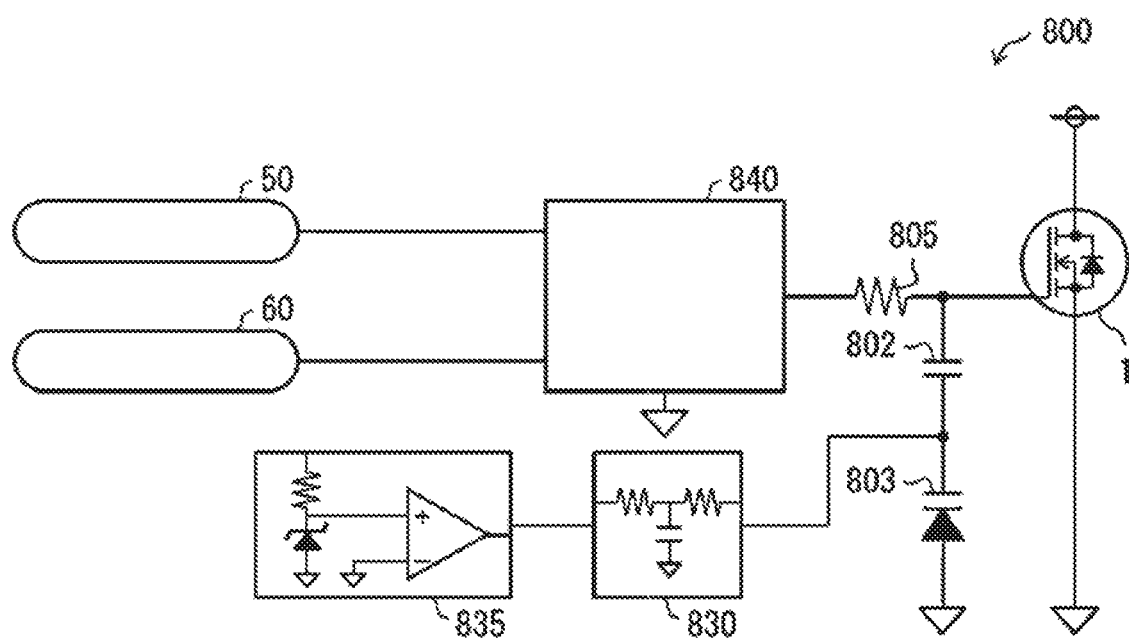
FIG. 15 is a block diagram illustrating the configuration of a major portion of a switching control circuit according to an eighth embodiment.

FIG. 15 is a block diagram illustrating the configuration of a major portion of a switching control circuit 800 according to the eighth embodiment. As illustrated in FIG. 15, in the switching control circuit 800, a capacitance changing circuit constituted by a gate driver 840, a variable capacitance diode 803, a white noise generator 835, and an integrator 830 is formed in one integrated circuit. Also, a gate resistor 805 and a direct-current blocking capacitor 802 are formed in the integrated circuit. In this manner, the switching control circuit 800 may be constituted by one integrated circuit.

According to this configuration, it is possible to preferably disperse noise in a unique frequency determined according to the characteristics of the gate driver 840.

Ninth Embodiment

A ninth embodiment of the present invention will be described below. For convenience of description, members having the same functions as the members described in the embodiments above are denoted by the same reference numerals, and descriptions thereof are not repeated.

Figure 16:
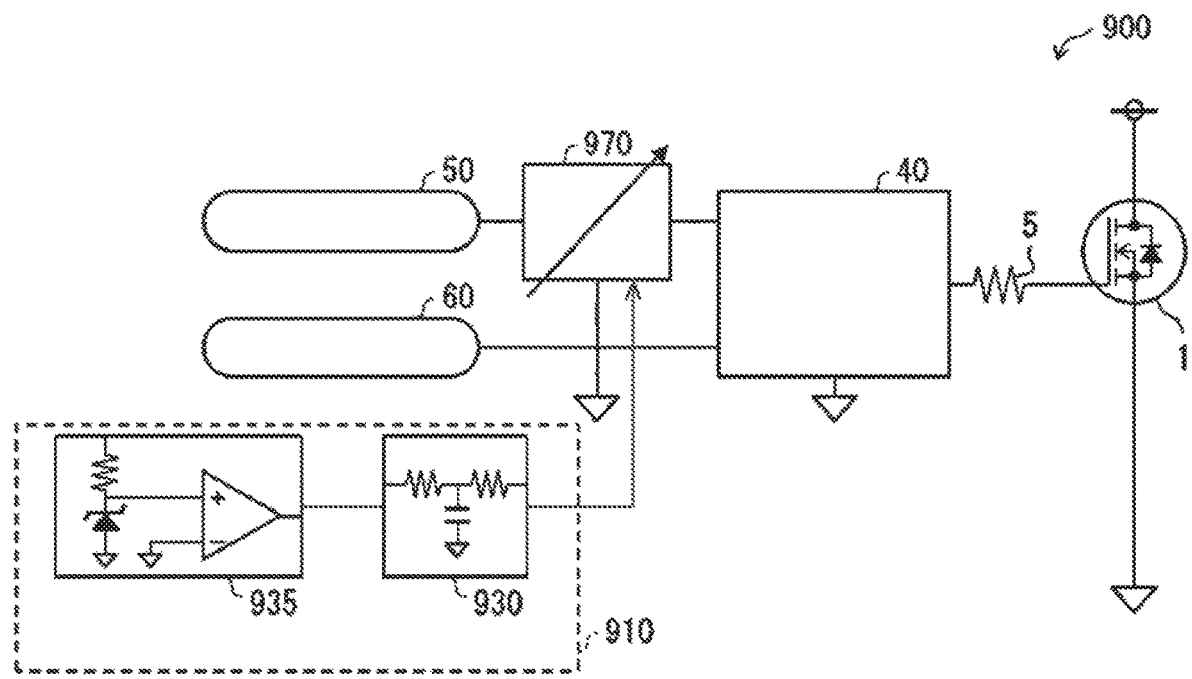
FIG. 16 is a block diagram illustrating the configuration of a major portion of a switching control circuit according to a ninth embodiment.

FIG. 16 is a block diagram illustrating the configuration of a major portion of a switching control circuit 900 according to the ninth embodiment. As illustrated in FIG. 16, the switching control circuit 900 comprises a gate driver 40, a gate drive power source 50, a PWM control signal generating unit 60, and an analog signal generator 910.

The gate driver 40 is connected to a gate of a switching element 1.

Power source is input to the gate drive power source 50, and the gate drive power source 50 outputs a drive power source voltage for driving the gate driver 40. Drive power source is supplied to the gate driver 40 via a regulator 970. A drive power source supply circuit that is a combination of the gate drive power source 50 and the regulator 970 is constituted.

The analog signal generator 910 comprises a white noise generator 935 and an integrator 930.

The white noise generator 935 causes generation of white noise that is non-periodic, random noise. The integrator 930 is connected to the regulator 970. The integrator 930 filters the white noise, output by the white noise generator 935, to manipulate an output voltage of the regulator 970.

The analog signal generator 910 is connected to the regulator 970, which is connected to the gate drive power source 50 and the gate driver 40. A random and stepless analog signal output from the analog signal generator 910 is input to the regulator 970 to manipulate the output voltage, thereby randomly and steplessly changing the drive power source voltage supplied to the gate driver 40.

Figure 17:
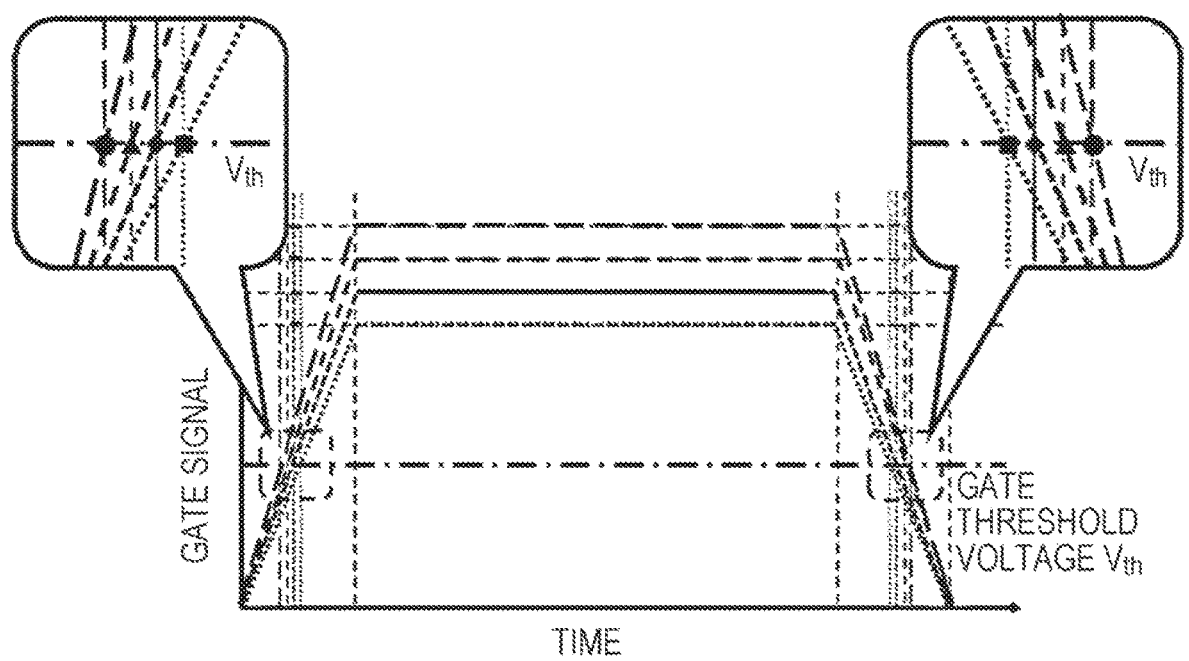
FIG. 17 is a graph illustrating changes in a gate voltage per unit time in the switching control circuit according to the ninth embodiment.

FIG. 17 is a graph illustrating relationships of the drive power source voltage, the switching speed, and the gradient of the gate signal. A random and stepless analog signal output from the analog signal generator 910 is input to the regulator 970, so that the drive power source voltage supplied to the gate driver 40 varies, as illustrated in FIG. 17. When the drive power source voltage varies, the rising speed and the falling speed of the switching speed change, and the gradient of the gate signal output from the gate driver 40 changes. This makes it possible to change the gradient of the gate signal during rising and during falling. Since the threshold voltage during ON and OFF of the switching element 1 is constant, the timing of the ON and OFF of the switching element 1 also changes when the gradient of the gate signal is changed. The timing of the ON and OFF of the switching element 1 randomly changes to thereby suppress occurrence of the peak of EMI noise in a unique frequency determined according to characteristics of the gate driver 40, thus making it possible to reduce EMI noise.

The present disclosure is not limited to each embodiment described above, various changes are possible within the scope recited in the claims, and embodiments obtained by appropriately combining the technical means respectively disclosed in different embodiments are also encompassed by the technical scope of the present disclosure. In addition, new technical features can be formed by combining the technical means respectively disclosed in the embodiments.

REFERENCE SIGNS LIST 1 switching element
3, 503, 803 variable capacitance diode (variable capacitance element)
5 gate resistor
10 oscillator
20, 520 pseudorandom-number generating circuit
30, 530, 630, 830, 930 integrator
40, 540, 840 gate driver
50 gate drive power source
60 PWM control signal generating unit
100, 200, 300, 400, 500, 600, 700, 800, 900 switching control circuit
110, 310, 410, 610, 910 analog signal generator (capacitance changing circuit)
270 PIN diode
335 digital-to-analog converter
470 magnetoresistance element
510 ring oscillator
635, 835, 935 white noise generator (white noise generation circuit)
670, 770 variable capacitance capacitor (variable capacitance element)

The invention claimed is:

1. A switching control circuit that controls on/off of a switching element, the switching control circuit comprising:
a gate driver connected to a gate of the switching element,
a variable capacitance element connected to the gate of the switching element; and
a capacitance changing circuit connected to the variable capacitance element to randomly change a capacitance of the variable capacitance element,
wherein the capacitance changing circuit comprises
an oscillator,
a pseudorandom-number generating circuit connected to the oscillator, and
an integrator connected to the pseudorandom-number generating circuit and the variable capacitance element.

2. The switching control circuit according to claim 1, wherein the variable capacitance element includes a variable capacitance diode.

3. The switching control circuit according to claim 1, wherein the variable capacitance element includes a PIN diode.

4. The switching control circuit according to claim 1, wherein the capacitance changing circuit comprises
a digital-to-analog converter connected to the pseudorandom-number generating circuit, and
wherein the integrator is connected to the digital-to-analog converter and the variable capacitance element, the integrator being connected to the pseudorandom-number generating circuit via the digital-to-analog converter.

5. The switching control circuit according to claim 1, wherein the variable capacitance element is a magnetoresistance element comprising a gate resistor connected to the gate of the switching element and a coil magnetically coupled to the gate resistor; and
wherein the capacitance changing circuit comprises
a current driver connected to the integrator and the coil, wherein the integrator is connected to the variable capacitance element via the current driver.

6. The switching control circuit according to claim 1, wherein the capacitance changing circuit comprises
the oscillator that is a ring oscillator,
the pseudorandom-number generating circuit connected to the ring oscillator, and
the integrator connected to the pseudorandom-number generating circuit and the variable capacitance element, and
wherein the gate driver, the variable capacitance element, and the capacitance changing circuit are formed in one integrated circuit.

7. A switching control circuit that controls on/off of a switching element, the switching control circuit comprising:
a gate driver connected to a gate of the switching element,
a variable capacitance element connected to the gate of the switching element; and
a capacitance changing circuit connected to the variable capacitance element to randomly change a capacitance of the variable capacitance element,
wherein the capacitance changing circuit comprises
a white noise generation circuit, and
an integrator connected to the white noise generation circuit and the variable capacitance element.

8. The switching control circuit according to claim 7, wherein the variable capacitance element includes a variable capacitance diode.

9. The switching control circuit according to claim 7, wherein the variable capacitance element includes a variable capacitance capacitor.

10. The switching control circuit according to claim 7, wherein the variable capacitance element is connected in parallel with a gate resistor connected to the gate of the switching element, and
the capacitance changing circuit outputs a signal for randomly changing the capacitance of the variable capacitance element in only a switching transition period of the switching element.

11. The switching control circuit according to claim 7, wherein the gate driver, the variable capacitance element, and the capacitance changing circuit are formed in one integrated circuit.

12. A switching control circuit that controls on/off of a switching element, the switching control circuit comprising:
a gate driver connected to a gate of the switching element,
a variable capacitance element connected to the gate of the switching element; and
a capacitance changing circuit connected to the variable capacitance element to randomly change a capacitance of the variable capacitance element,
wherein the capacitance changing circuit is a circuit that causes generation of at least one of
a triangular wave that is asynchronous with a switching cycle of the switching element and
a sawtooth wave that is asynchronous with the switching cycle of the switching element.

* * * * *